United States Patent
Cariello et al.

(10) Patent No.: US 11,029,746 B2
(45) Date of Patent: Jun. 8, 2021

(54) DYNAMIC POWER MANAGEMENT NETWORK FOR MEMORY DEVICES

(71) Applicant: Micron Technology, Inc., Boise, ID (US)

(72) Inventors: Giuseppe Cariello, Boise, ID (US); Jonathan S. Parry, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 97 days.

(21) Appl. No.: 16/427,280

(22) Filed: May 30, 2019

(65) Prior Publication Data
US 2020/0379546 A1    Dec. 3, 2020

(51) Int. Cl.
*G06F 1/32* (2019.01)
*G06F 1/3234* (2019.01)

(52) U.S. Cl.
CPC .......... *G06F 1/3268* (2013.01); *G06F 1/3275* (2013.01)

(58) Field of Classification Search
CPC ........ G06F 1/3268; G06F 1/3275; G06F 1/32; G06F 1/329
USPC .......................................... 713/320; 365/226
See application file for complete search history.

(56) References Cited

U.S. PATENT DOCUMENTS

| | | | | |
|---|---|---|---|---|
| 5,894,579 A | * | 4/1999 | Fujihara | G11C 29/021 714/768 |
| 6,487,202 B1 | * | 11/2002 | Klausmeier et al. | G06F 11/073 714/764 |
| 9,170,639 B2 | * | 10/2015 | Henderson | G06F 1/3275 |
| 10,372,373 B1 | * | 8/2019 | Benisty | G06F 3/0653 |
| 2014/0304566 A1 | * | 10/2014 | Henderson | G06F 11/073 714/764 |
| 2016/0378590 A1 | * | 12/2016 | Roh | G11C 29/021 714/768 |

* cited by examiner

*Primary Examiner* — Chun Cao
(74) *Attorney, Agent, or Firm* — Nicholson De Vos Webster & Elliott LLP

(57) ABSTRACT

Techniques for managing power usage in a memory subsystem are described. An operation type of each of a plurality of operations queued against one or more of a plurality of memory components is obtained. It is determined that at least two of the plurality of operations can be performed in parallel and that a first configuration of the plurality of memory components does not allow the at least two operations to be performed in parallel, the first configuration including a first set of power management cohorts. An interconnection of the plurality of memory components is reconfigured to change from the first configuration to a second configuration of the of the plurality of memory components, the second configuration including a second set of power management cohorts that allow the at least two operations to be performed in parallel.

20 Claims, 5 Drawing Sheets

DYNAMIC POWER MANAGEMENT NETWORK FOR MEMORY DEVICES

TECHNICAL FIELD

The present disclosure generally relates to power management, and more specifically, relates to a dynamic power management network for memory devices.

BACKGROUND ART

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory subsystem to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
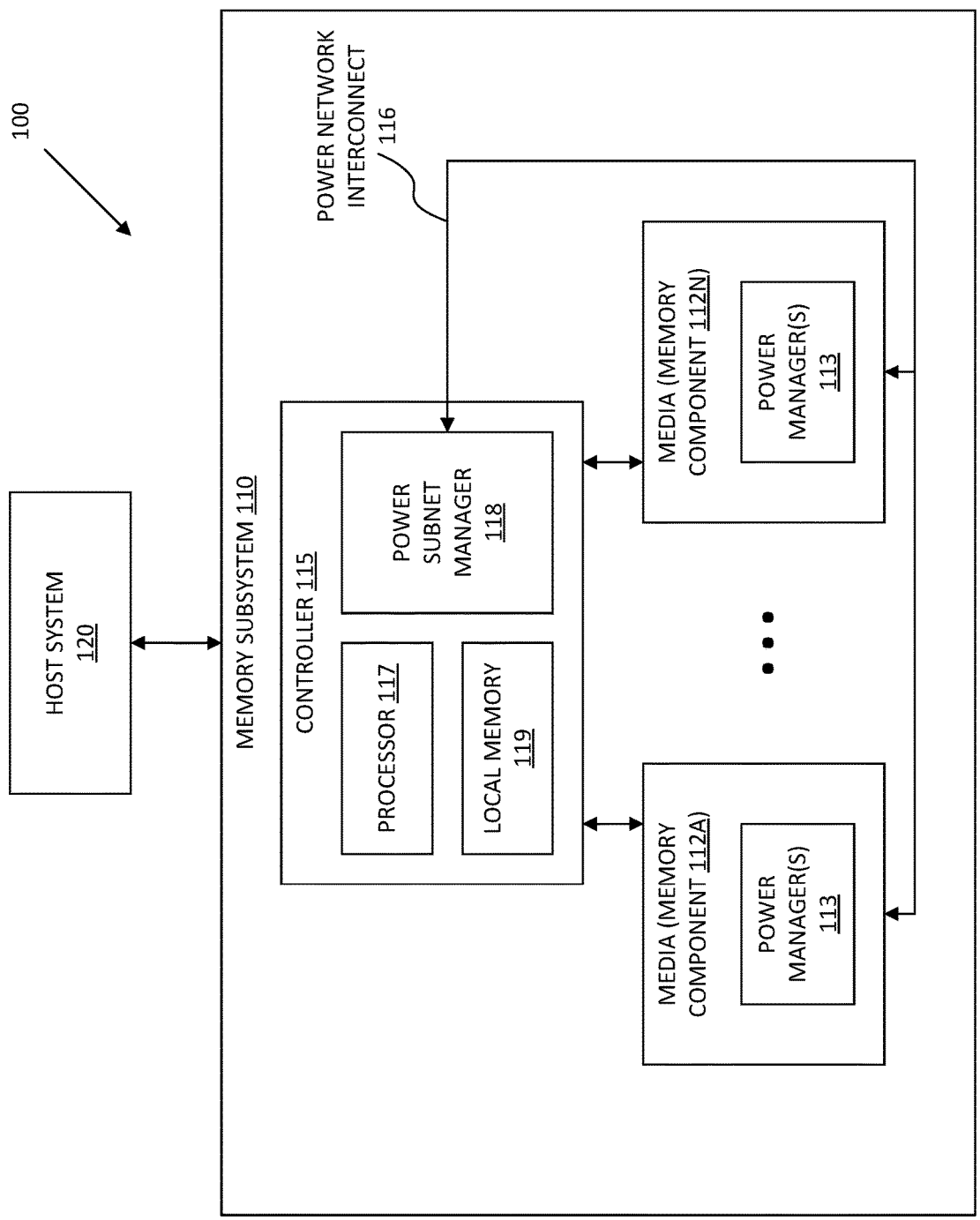
FIG. 1 illustrates an example computing environment that includes a memory subsystem in accordance with some embodiments of the present disclosure.

Aspects of the present disclosure are directed to dynamic power management in a memory subsystem. A memory subsystem is also hereinafter referred to as a "memory device." An example of a memory subsystem is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. Another example of a memory subsystem is a storage device that is connected to the central processing unit (CPU) via a peripheral interconnect (e.g., an input/output bus, a storage area network, etc.). Examples of storage devices include a solid-state drive (SSD), a flash drive, a universal serial bus (USB) flash drive, and a hard disk drive (HDD). In some embodiments, the memory subsystem is a hybrid memory/storage subsystem. In general, a host system can utilize a memory subsystem that includes one or more memory components. The host system can provide data to be stored at the memory subsystem and can request data to be retrieved from the memory subsystem.

When integrated into a larger system, the memory subsystem can be subject to a power budget that limits the amount of power either provided or available to the memory subsystem to perform data storage operations. For example, a memory subsystem for a mobile device (e.g., a smartphone) may have a much lower limit on the amount of power that it can draw as compared to a memory subsystem for a desktop computer system. Regardless of the use case, the memory subsystem thus has to operate within its proscribed power budget (e.g., up to the limit), which can limit the number and types of concurrent data storage operations that can be performed.

Different types of data storage operations can have different power requirements. For example, an operation to erase a block of memory can draw more power than an operation to write to the block of memory, which in turn can draw more power than an operation to read the block of memory. Moreover, the memory subsystem is often divided into many parallel memory structures (e.g., dice) that can independently perform data storage operations. However, due to a power budget, all of the structures may not be permitted to perform high-power operations at the same time. One approach to managing power consumption by these parallel structures is to introduce a communications interface between the structures to allow the structures to contend or arbitrate for time during which they can perform operations with high-power requirements while blocking other structures from doing the same. As the number of structures on this communications interface increases, the increased time required to negotiate for time to perform high-power operations can reduce overall performance. Furthermore, if one high-power operation by one structure blocks high-power operations on all other structures, it may not be possible for the memory subsystem to maximally utilize its power budget when the power budget allows for more than one structure to perform a high-power operation at a time.

Aspects of the present disclosure address the above and other deficiencies by reconfiguring a dynamic power management network of the memory subsystem based on operational requirements. In particular, the parallel memory structures (e.g., dice) are divided into power subnetworks ("subnets"), each subnet having one or more memory structures. Depending on the types of operations queued against those memory structures, a power subnetwork manager can determine whether to couple communications between two or more subnets. In operation, the memory structure(s) on a single, isolated subnet or on coupled subnets form a power management cohort. The memory structures on a common power management cohort communicate to coordinate power consumption. For example, if the power budget allows for two high-power operations to be performed by different memory structures at the same time, the power subnetwork manager can create two power management cohorts, distributing subnets containing the memory structures targeted by the high-power operations amongst the two cohorts. In this way, a high-power operation performed by a memory structure in one cohort does not block a high-power operation performed by another memory structure in the other cohort. Furthermore, if one or more subnets do not have memory structures targeted by high-power operations, the power subnetwork manager can create another power management cohort that includes those memory structures to avoid including them in one of the two power management cohorts with high-power operations to reduce the arbitration time for high-power operations.

FIG. 1 illustrates an example computing environment 100 that includes a memory subsystem 110 in accordance with some embodiments of the present disclosure. The memory subsystem 110 can include media, such as memory components 112A to 112N. The memory components 112A to 112N can be volatile memory components, non-volatile memory components, or a combination of such. In some embodiments, the memory subsystem is a storage system. An example of a storage system is an SSD. In some embodiments, the memory subsystem 110 is a hybrid memory/storage subsystem. In general, the computing environment 100 can include a host system 120 that uses the memory subsystem 110. For example, the host system 120 can write data to the memory subsystem 110 and read data from the memory subsystem 110.

The host system 120 can be a computing device such as a desktop computer, laptop computer, network server, mobile device, or such computing device that includes a memory and a processing device. The host system 120 can include or be coupled to the memory subsystem 110 so that the host system 120 can read data from or write data to the memory subsystem 110. The host system 120 can be coupled to the memory subsystem 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory subsystem 110. The host system 120 can further utilize an NVM Express (NVMe) interface to access the memory components 112A to 112N when the memory subsystem 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and an MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EE-PROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory subsystem 110, including handling communications between the memory subsystem 110 and the host system 120. In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115, and can instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory components 112A to 112N.

The memory subsystem 110 includes a power manager 113 for each memory structure that coordinates with other power managers to manage power consumption. Exemplary memory structures include the memory components 112, described above (e.g., dice or other groupings of memory cells that are operated on as a group). The memory structures are coupled to power subnets, each subnet including one or more memory structures. The memory subsystem 110 further includes a power subnet manager 118 that can reconfigure a power network interconnect 116 to change the connectivity of power subnets. For example, the power subnet manager 118 can configure the power network interconnect 116 to couple two or more subnets to form a single power management cohort or to leave a given subnet isolated from other subnets to allow the structures on the given subnet to operate as a power management cohort. Each power manager 113 can receive/transmit signals controlling power consumption from/to other power managers 113 within a power management cohort.

In some embodiments, the controller 115 includes at least a portion of the power subnet manager 118. For example, the controller 115 can include a processor 117 (processing device) configured to execute instructions stored in local memory 119 for performing the operations described herein. In some embodiments, the power subnet manager 118 is part of the host system 120, an application, or an operating system. In some embodiments, the memory subsystem 110 includes an interface through which the host system 120 can control the reconfiguration of the power network interconnect 116 by the power subnet manager 118. For example, a driver application executed by the host system 120 can send a command to the memory subsystem 110 to set a flag, which enables or disables reconfiguration of the power network interconnect 116. As another example, the application can send a command to write a value to the memory subsystem reflecting the power budget. The memory subsystem can use the power budget to determine a maximum number of concurrent high-power operations. Such commands can write to a configuration register or other memory location of the memory subsystem 110.

Figure 2:
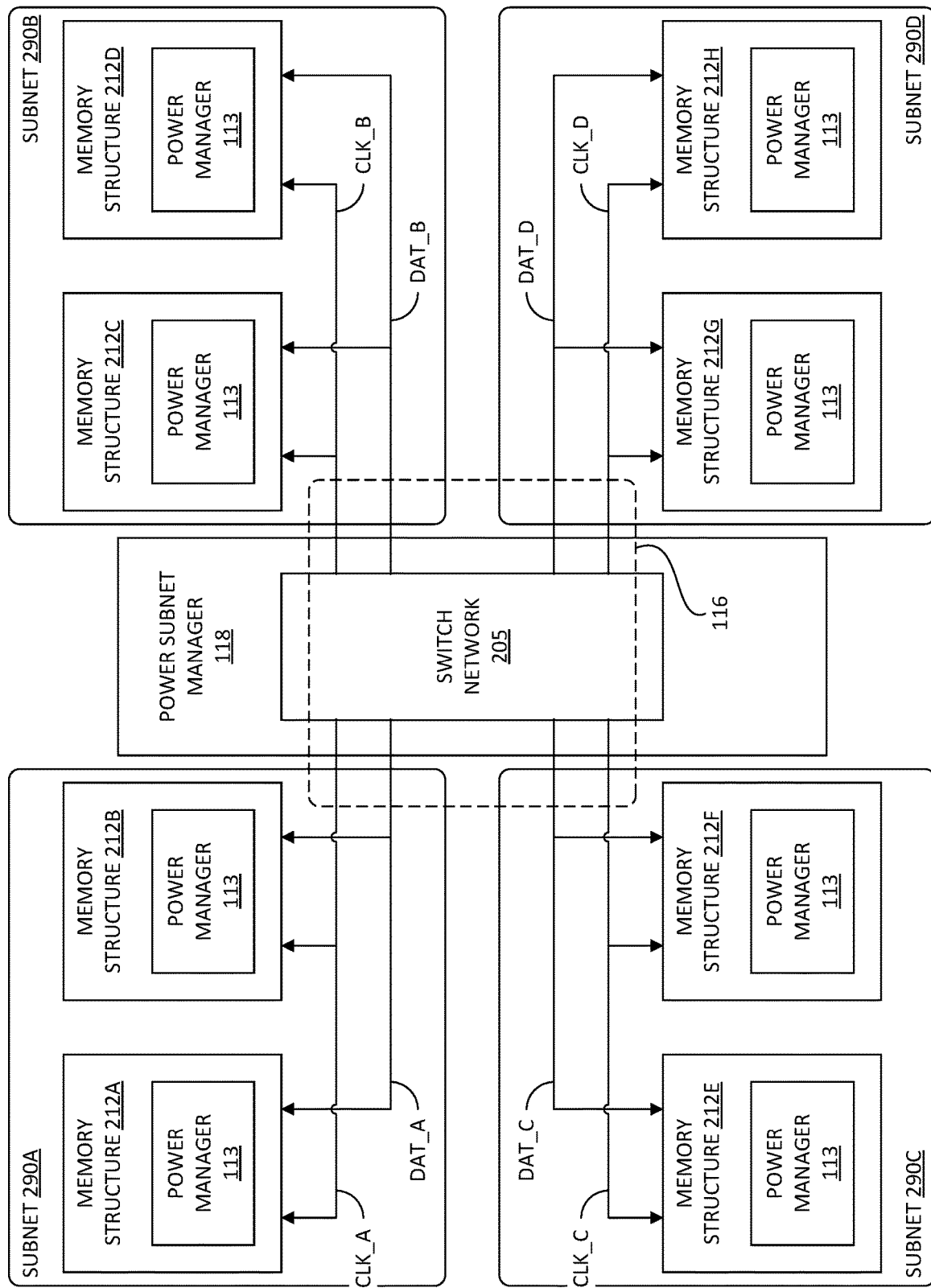
FIG. 2 illustrates a block diagram of an example dynamic power management network in accordance with some embodiments of the present disclosure.

FIG. 2 illustrates a block diagram of an example dynamic power management network in accordance with some embodiments of the present disclosure. In this example, the dynamic power management network includes four subnets, 290A to 290D. Each subnet 290 includes two memory structures 212 (e.g., a memory component 112), each having a power manager 113. Other embodiments may include a dynamic power management network with more or fewer subnets (e.g., two, three, five, fifty, etc.), and/or subnets with more or fewer memory structures 212 (e.g., one, three, four, sixteen, etc.).

The power subnet manager 118 responds to operational requirements of the memory subsystem by reconfiguring the power network interconnect 116. The power subnet manager 118 can monitor operations to be dispatched to the memory structures 212 and, based on the type of those operations, reconfigure the connectivity of power subnets to form power management cohorts that improve usage of the total power budget allocated to the memory subsystem. For example, if N memory structures 212 are targeted by high-power operations and the total power budget allows for two concurrent high-power operations, the power subnet manager 118 can divide the N memory structures 212 into two power management cohorts. The power managers 113 within a given cohort manage power consumption by their respective memory structures 212.

One approach to managing power consumption amongst memory structures 212 is to introduce a communications interface between them. Here, the power managers 113 include a communications interface that includes a clock signal (CLK) and a data signal (DAT). In an exemplary power management technique, the power managers 113 within a power management cohort contend for time during which their associated memory structure 212 can perform operations with high-power consumption while blocking other memory structures 212 within the power management cohort from doing the same. In particular, each power manager 113 can have an assigned slot in time (relative to the clock) during which to assert performance of a high-power operation. For example, if the power subnet manager 118 formed a power management cohort of subnets 290A and 290B, the power managers 113 of the four memory structures 212A to 212D would each be assigned a time slot. Under this round-robin like approach, a power manager 113 asserts usage of power for a high-power operation by asserting the data signal during its assigned time slot. To prevent starving other memory structures of an opportunity to perform high-power operations, the power manager 113 waits to re-assert usage until after each of the other power managers 113 within the power management cohort have had an opportunity to assert the signal during their respective time slots (referred to herein as a "back-off" time). If there are N memory structures 212 on a power management cohort and each needs to perform multiple high-power operations, each of the memory structures 212 waits for at least N-1 other high-power operations to complete before beginning its next high-power operation.

Note that the time to perform the high-power operation can last for many clock cycles. Other power sharing techniques are possible, such as allowing power managers 113 to share granular data about their respective power usage to other power managers 113 on a power management cohort to permit more efficient usage of a power budget.

In the illustrated example, memory structures 212A, 212B within power subnet 290A share signals CLK_A and DAT_A; memory structures 212C, 212D within power subnet 290B share signals CLK_B and DAT_B; memory structures 212E, 212F within power subnet 290C share signals CLK_C and DAT_C; and memory structures 212G, 212H within power subnet 290D share signals CLK_D and DAT_D. To facilitate reconfiguration, the power subnet manager 118 includes a switch network 205. The switch network 205 includes a plurality of switches to bidirectionally couple signals of the power network interconnect 116. For example, the power subnet manager 118 can configure the switch network 205 to connect CLK_A to CLK_B and DAT_A to DAT_B to combine power subnets 290A and 290B. As another example, the power subnet manager 118 can configure the switch network 205 to connect CLK, B, CLK_C, and CLK_D and, separately, connect DAT_B, DAT_C, and DAT_D to combine power subnets 290B, 290C, and 290D.

The switches can be formed as part of a multiplexer, crossbar, or other group of switches with control signals that control whether the various power network interconnect 116 signals are connected. In the illustrated dynamic power management network, the power subnet manager 118 can configure the power subnets 290A to 290D as four separate power management cohorts, as two power management cohorts (e.g., one power management cohorts having a single power subnet and another power management cohorts having three connected power subnets or two power management cohorts each having two power subnets), as three power management cohorts (e.g., one power management cohorts having two power subnets and two other power management cohorts each having a single power subnet), or as a single power management cohort (e.g., all four power subnets connected). Although illustrated within the power subnet manager 118, the switch network 205 can be external to the power subnet manager 118 or even to the controller (e.g., the controller 115 of FIG. 1).

One advantage of reconfiguring the power network interconnect 116 to change the membership of memory structures 212 within power management cohorts is to reduce power management overhead, including the back-off time within a group. If a particular memory structure 212 has a series of high-powered operations queued against it, limiting the number of other memory structures 212 within the same cohort (e.g., by not coupling the subnet 290 including the particular memory structure 212) reduces the amount of time that memory structure 212 will have to wait before performing another high-power operation.

The power subnet manager 118 can evaluate the type of operations queued against memory structures 212 to determine how to connect the power subnets 290 into power management cohorts. If the number of queued high-power operations does not exceed the maximum number of concurrent high-power operations permitted by the power budget, the power subnet manager 118 can create a matching number of power management cohorts, assuming each of the memory structures with queued high-power operations can be isolated (e.g., each of the memory structures having an queued high-power operation is on a different subnet 290). For example, if there are two queued high-power operations against two memory structures and a maximum of three concurrent high-power operations, the power subnet manager 118 can permit the two concurrent high-power operations by configuring the power network interconnect 116 such that the two memory structures are part of separate power management cohorts.

If more than the maximum number of concurrent high-power operations permitted by the power budget are queued, the power subnet manager 118 can create a number of power management cohorts equal to the maximum number of concurrent high-power operations permitted by the power budget, assuming that number of memory structures with queued high-power operations can be isolated (e.g., each of the memory structures having an queued high-power operation is on a different subnet 290). The power subnet manager 118 can configure the power network interconnect 116 to form power management cohorts in a manner that evenly distributes the memory structures 212 with queued high-power operations amongst those power management cohorts to minimize the number of memory structures arbitrating for high-current operation time on the within a power management cohort using the power sharing technique described above. For example, if there are twelve queued high-power operations against twelve memory structures but only a maximum of three concurrent high-power operations, the power subnet manager 118 can achieve an optimal power management cohort configuration if the twelve memory structures can be divided four-per power management cohort.

In some embodiments, the power subnet manager 118 can further improve performance by placing memory structures that do not have queued high-power operations on a separate power management cohort. In doing so, the memory structures that do have queued high-power operations wait a fewer number of slots before re-asserting performance of a high-power operation (i.e., they have a reduced back-off time due to the reduced number of memory structures within their cohort).

In some embodiments, the power subnet manager 118 can further reduce power consumption by isolating any power subnets 290 having memory structures 212 without queued operations to reduce the power associated with the clock generation and distribution to those memory structures 212.

With reference to FIG. 2, the examples in the following tables are illustrative. In a first example, the power subnet manager 118 has determined there can be two concurrent high-power operations and there are the below queued operations against each memory structure 212.

| STRUCT. | QUEUED OPERATION | SUBNET | COHORT |
|---|---|---|---|
| 212A | HIGH-POWER | 290A | 1 |
| 212B | LOW POWER | 290A | |
| 212C | LOW POWER | 290B | 2 |
| 212D | HIGH-POWER | 290B | |
| 212E | LOW POWER | 290C | 3 |
| 212F | LOW POWER | 290C | |
| 212G | LOW POWER | 290D | |
| 212H | NONE | 290D | |

As shown in the above table, the power subnet manager 118 reconfigures the power network interconnect 116 (e.g., via the switch network 205) such that power subnets 290C and 290D form a power management cohort since none of the queued operations will contend for high-power consumption. Furthermore, power subnets 290A and 290B remain independent power management cohorts to allow a memory structure on one subnet to perform a high-power operation without blocking a memory structure on the other subnet from performing a high-power operation. Note that by combining power subnets 290C and 290D into a single power management cohort, the power subnet manager 118 can reduce overall power consumption by reducing the number of clocks generated (i.e., instead of separate clocks for each of subnets 290A and 290B, the cohort of combined subnets utilizes a single clock).

In a second example, the power subnet manager 118 has determined there can be one high-power operation at a time and there are the below queued operations against each memory structure 212.

| STRUCT. | QUEUED OPERATION | SUBNET | COHORT |
|---|---|---|---|
| 212A | HIGH-POWER | 290A | 1 |
| 212B | HIGH-POWER | 290A | |
| 212C | LOW POWER | 290B | |
| 212D | HIGH-POWER | 290B | |
| 212E | LOW POWER | 290C | 2 |
| 212F | LOW POWER | 290C | |
| 212G | NONE | 290D | 3 |
| 212H | NONE | 290D | |

As shown in the above table, the power manager 118 reconfigures the power network interconnect 116 (e.g., via the switch network 205) such that power subnets 290A and 290B form a power management cohort. Since the memory structures 212A, 212B, and 212C will contend for a period of time to perform a high-power operation, placing each of these memory structure 212 with queued high-power operations on the same power management cohort will ensure the limit of one high-power operation at a time will not be exceeded. The power manager 118 has placed subnet 290C on a separate power management cohort to reduce contention delays in the power management cohort including subnets 290A and 290B. That is, rather than permit up to six memory structures 212 to contend for the opportunity to perform high-power operations, only four memory structures 212 have to contend for such operations, thereby reducing the number of slots (and clock cycles) from six to four. Finally, assuming the memory structures 212 can enter a low power or idle state, the power manager 118 has isolated subnet 290D from the other subnets because those memory structures 212 do not have any queued operations against them. As a result, the additional power consumption associated with clock generation and distribution can be avoided. Alternatively, the power manager 118 could have included subnet 290D on the power management cohort including subnet 290C.

Note that although the above tables show only a single queued operation per structure 212, other embodiments can look at multiple queued operations or even a per-memory structure workload profile that has been gathered over time to determine how to configure the power management cohorts. For example, if the next nine out of ten operations queued for memory structure 212C are high-power operations, the power subnet manager 118 can prioritize the memory structure 212C for isolation within its own subnet to allow other memory structures 212 that have fewer queued high-power operations to avoid competing with the memory structure 212C. Conversely, if a group of memory structures 212 has mostly low power operations queued against them, the power subnet manager 118 can group those memory structures 212 onto a single power subnet given the low number of contentions that could occur.

Regarding clock generation and slot assignment for each power management cohort (in the above-described round-robin approach), in some embodiments, the power subnet manager 118 can issue commands to the memory structures 212 to reconfigure their behavior as part of power management cohort reconfiguration. As an example, the following table and description relates to the power subnet manager 118 reconfiguring the power network interconnect 116 to form a single power management cohort from two power management cohorts.

| STRUCT. | SUBNET | COHORT (BEFORE RECONFIG- URATION) | COHORT (AFTER RECONFIG- URATION) |
| --- | --- | --- | --- |
| 212A | 290A | 1 | 1 |
| 212B | 290A | | |
| 212C | 290B | 2 | |
| 212D | 290B | | |

As shown in the above table, the power manager 118 reconfigures the power network interconnect 116 (e.g., via the switch network 205) to connect power subnets 290A and 290B. Prior to reconfiguration, the power subnet manager 118 can cause the impacted memory structures 212 to enter a quiescent state. For example, if the memory structures have a local queue and controller, the power subnet manager 118 can assert a signal to each of the impacted memory structures 212 to pend processing queued operations. As another example, if the memory structures directly process commands issued from the controller 115, the power subnet manager 118 can cause the controller to temporarily suspend issuing commands to the impacted memory structures 212 while the power management cohorts are being reconfigured.

Once each of the memory structures 212 impacted by the reconfiguration has entered a quiescent state, the power manager 118 can connect the power subnets 290A and 290B (e.g., by closing switches in the switch network 205). In this example, the power manager 118 configures the power network interconnect 116 such that power subnets 290A and 290B—which were operating as separate power management cohorts—operate as a single power management cohort.

Various embodiments can configure the intra-cohort communications in different ways. In this example, assume that prior to reconfiguration, the power management cohort 1 included memory structure 212A configured as the master of the cohort (generating a clock) and assigned time slot 0 and memory structure 212B assigned time slot 1. Likewise, the power management cohort 2 included memory structure 212C configured as the master of the cohort (generating a clock) and assigned time slot 0 and memory structure 212D assigned time slot 1. In this scenario, the power manager 118 can issue a command to each of the memory structures 212 impacted through reconfiguration to inform them of the new size of the power management cohort (e.g., in this example, from two to four). Further, the power manager 118 can issue a command to memory structure 212C to configure it as a slave and assign it time slot 2 and a command to memory structure 212D to assign it time slot 3. After configuring the impacted memory structures 212, the power subnet manager 118 can allow the impacted memory structures to continue processing data operations (e.g., by de-asserting the signal or indicating to the controller 115 that commands can continue to be issued).

Note that the process of dividing a single power management cohort into multiple power management cohorts can be carried out similar to the process described above.

Figure 3:
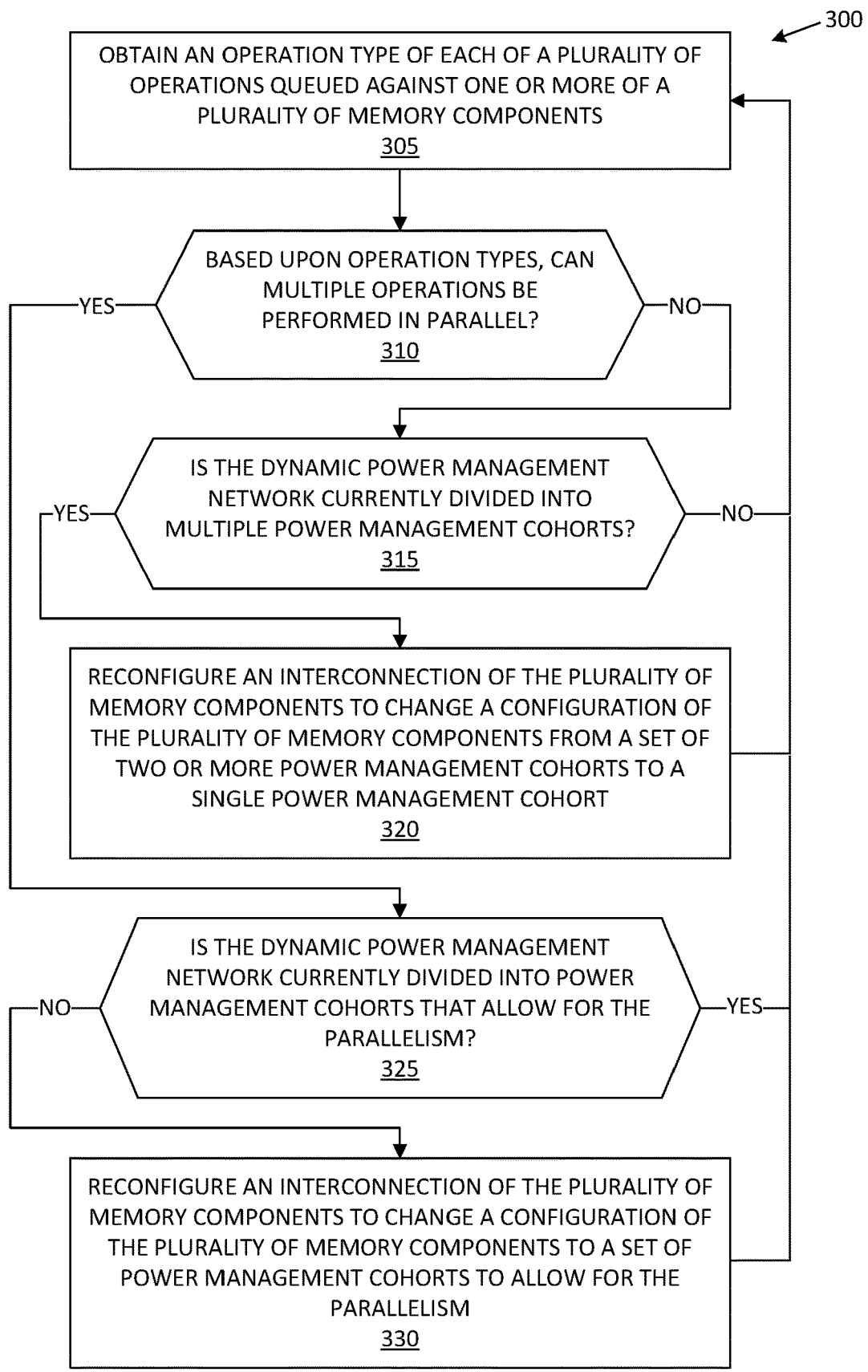
FIG. 3 is a flow diagram of an example method to control a dynamic power management network in accordance with some embodiments of the present disclosure.

FIG. 3 is a flow diagram of an example method 300 to control a dynamic power management network in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the power subnet manager 118 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device obtains an operation type of each of a plurality of operations queued against one or more of a plurality of memory components. As described above, the controller can carry out commands from a host system on the memory components or carry out other internal operations (e.g., garbage collection) with the memory components. These commands can be passed through one or more stages of a command processing pipeline, one or more of which can include a queue of operations against each of the memory components. The controller can inspect the queued commands to determine their types (e.g., read, write, or erase). Different types of commands can have different power requirements. For example, a write operation can have a higher power requirement than a read operation, and an erase operation can have a higher power requirement that the write operation.

At operation 310, the processing device determines, based upon the obtained operation types, whether multiple operations can be performed in parallel. As described above, a memory subsystem typically must operate within a power budget, and different operation types can be associated with different power requirements. Depending on the types and numbers of queued operations against the plurality of memory components and the power budget of the memory subsystem, the processing device can determine whether operations can be performed in parallel. If so, the method 300 proceeds to operation 325. Otherwise, the method 300 proceeds to operation 315.

At operation 315, the processing device checks whether the dynamic power management network is divided into multiple power management cohorts. For example, whether the power subnets 290 of FIG. 2 are all connected to together into a single power management cohort with eight memory components 212. If so, the method 300 returns to operation 305, described above, otherwise, the method 300 proceeds to operation 320.

At operation 320, the processing device reconfigures an interconnection of the plurality of memory components to group the plurality of memory components into a single power management cohort. As described above, memory components 212 connected to a power network share the power budget. Since only a single operation could be performed, as determined at operation 310, the processing device forms an undivided power network to limit the number of operations that can be performed in parallel to one. The method returns to operation 305, described above.

At operation 325, the processing device checks whether the dynamic power management network is divided into power management cohorts that allow for the parallelism. For example and with reference to FIG. 2, there can be a two concurrent high-power operation limit and the processing device has determined that there are the below queued operations against memory components 212.

| STRUCT. | QUEUED OPERATION | SUBNET | COHORT (OPTION 1) | COHORT (OPTION 2) | COHORT (OPTION 3) |
|---|---|---|---|---|---|
| 212A | HIGH-POWER | 290A | 1 | 1 | 1 |
| 212B | LOW POWER | 290A | | | |
| 212C | LOW POWER | 290B | 2 | | 2 |
| 212D | HIGH-POWER | 290B | | | |
| 212E | LOW POWER | 290C | | 2 | 1 |
| 212F | HIGH-POWER | 290C | | | |
| 212G | LOW POWER | 290D | 3 | 3 | 3 |
| 212H | NONE | 290D | | | |

As shown in the above table, to limit the number of concurrent high-power operations to two, the processing device can configure the switch network 205 per one of three possible configurations of three power management cohorts. In particular, power subnets 290A and 290B can be connected to form a single power management cohort, power subnets 290B and 290C can be connected to form a single power management cohort, or power subnets 290A and 290C can be connected to form a single power management cohort. If the current power network configuration is one of the three options, the method 300 returns to operation 305, described above, otherwise, the method 300 proceeds to operation 330. Note that in this example, the power subnet 290D does not have any queued high-power operations and can thus be operated as a separate power management cohort to reduce the number of time slots on the other two power management cohorts.

At operation 330, the processing device reconfigures an interconnection of the plurality of memory components to change a configuration of the plurality of memory components to a set of power management cohorts that allow for the operation parallelism. Continuing the above example introduced for operation 325, the processing device can adjust the connectivity of the memory components to form one of the three options for configurations of power management cohorts. That is, the processing device can open and close one or more switches of a switch network, such as switch network 205, to interconnect the clock and data signals of the power subnets 290 to achieve one of the three configurations shown above.

Figure 4:
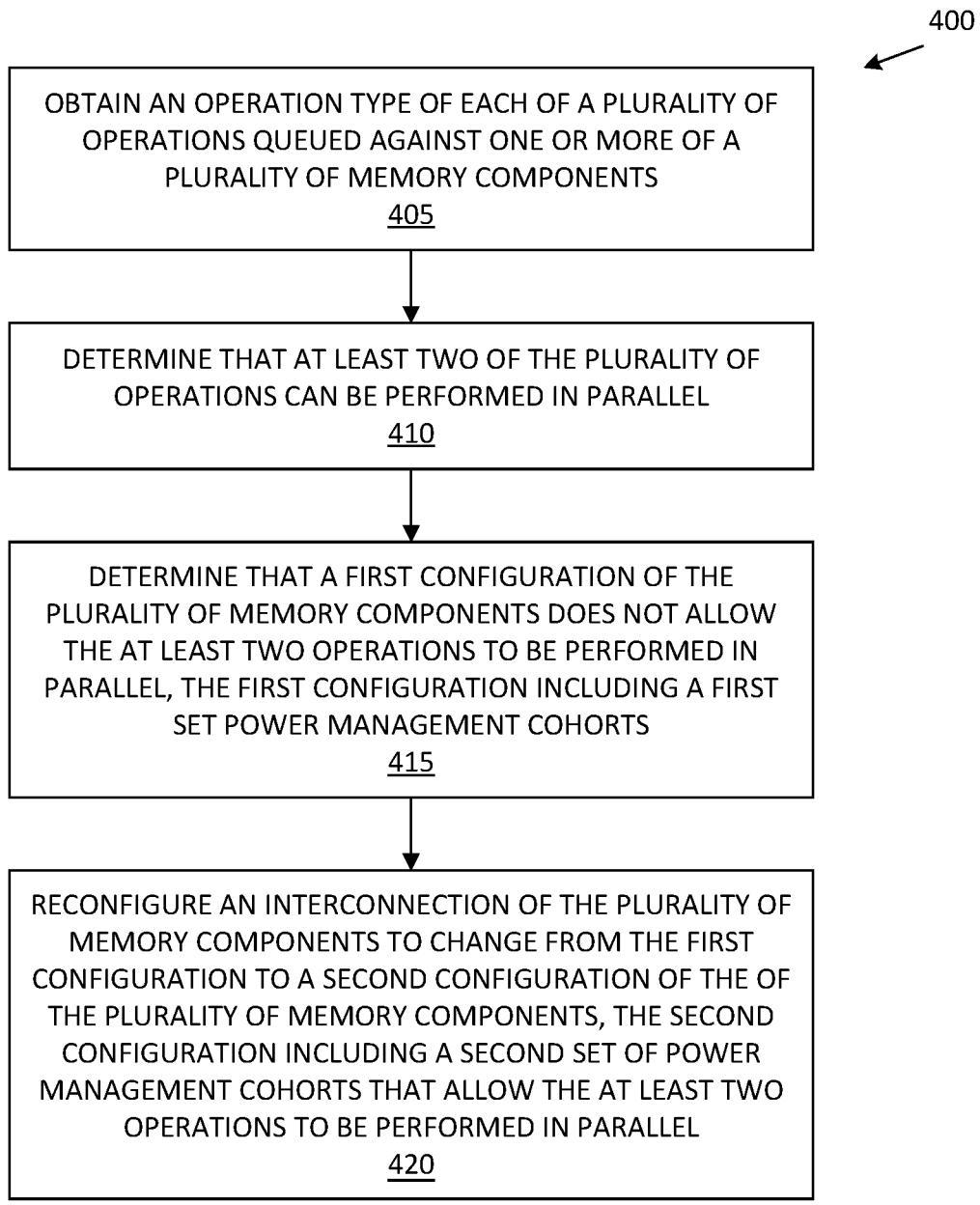
FIG. 4 is a flow diagram of another example method to control a dynamic power management network in accordance with some embodiments of the present disclosure.

FIG. 4 is a flow diagram of another example method 400 to control a dynamic power management network in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the power subnet manager 118 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device obtains an operation type of each of a plurality of operations queued against one or more of a plurality of memory components such as described above with reference to operation 305.

At operation 410, the processing device determines that at least two of the plurality of operations can be performed in parallel such as described above with reference to operation 310.

At operation 415, the processing device determines that a first configuration of the plurality of memory components does not allow the at least two operations to be performed in parallel, the first configuration including a first set power management cohorts such as described above with reference to operation 325.

At operation 420, the processing device reconfigures an interconnection of the plurality of memory components to change from the first configuration to a second configuration of the of the plurality of memory components, the second configuration including a second set of power management cohorts that allow the at least two operations to be performed in parallel such as described above with reference to operation 330.

As described above, the plurality of memory components can be arrays of memory cells, and power management cohorts can include one or more interconnected arrays. A controller can connect and disconnect subnets to form power management cohorts of one or more subnets. Memory components that are part of the same power management cohort coordinate so as to limit the number of concurrent high-power operations performed by the memory components. By increasing the number of connected power subnets within a power management cohort, an increased number of memory components coordinate operations with the cohort, and vice versa. Based on queued operation types, the controller can adjust which subnets are connected together to improve the overall performance of the memory subsystem as described herein.

Figure 5:
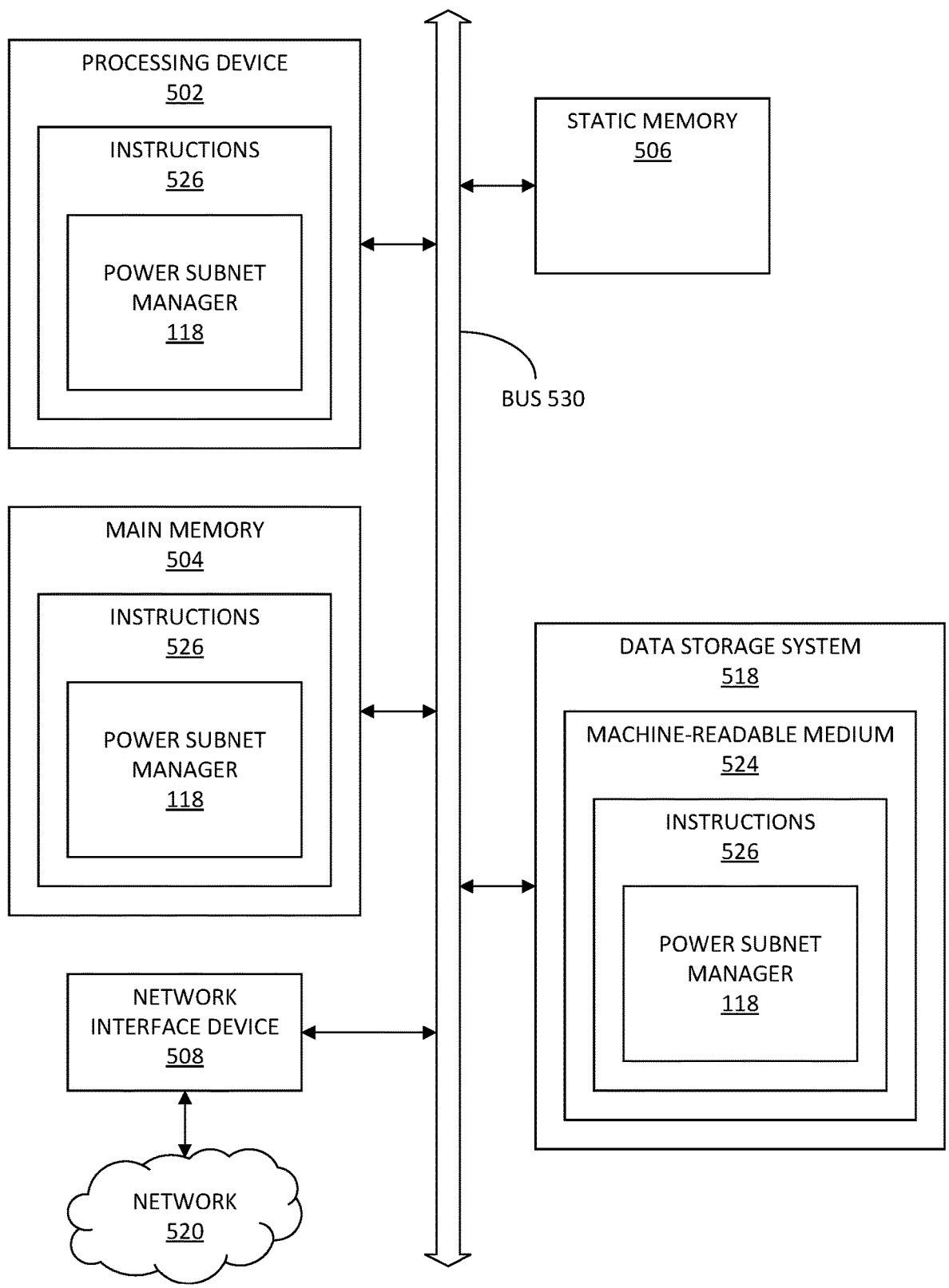
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the power subnet manager 118 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Furthermore, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to a power subnet manager (e.g., the power subnet manager 118 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, can carry out the computer-implemented method 300 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   obtaining an operation type of each of a plurality of operations queued against one or more of a plurality of memory components;
   determining that at least two of the plurality of operations can be performed in parallel;
   determining that a first configuration of the plurality of memory components does not allow the at least two operations to be performed in parallel, the first configuration including a first set of power management cohorts; and
   altering an interconnection of the plurality of memory components to change from the first configuration to a second configuration of the of the plurality of memory components, the second configuration including a second set of power management cohorts that allow the at least two operations to be performed in parallel.

2. The method of claim 1, wherein altering the interconnection comprises closing a first set of one or more switches to couple a clock signal generated by a first memory component of a first power management cohort to each of the other memory components of the first power management cohort.

3. The method of claim 2, wherein altering the interconnection comprises closing a second set of one or more switches to couple a data signal amongst a plurality of memory components of the first power management cohort.

4. The method of claim 1, wherein only a single memory component of a first power management cohort of the second set of power management cohorts has a queued high-power operation.

5. The method of claim 1, wherein altering the interconnection is conditioned on a flag accessible by a host system.

6. The method of claim 1, wherein the operation type is one of at least a high-power operation and a low-power operation.

7. The method of claim 1, wherein:
   the second set of power management cohorts includes a first power management cohort; and
   none of a plurality of memory components of the first power management cohort have a queued high-power operation.

8. A non-transitory computer-readable storage medium comprising instructions that, when executed by a processing device, cause the processing device to:
   obtain an operation type of each of a plurality of operations queued against one or more of a plurality of memory components;
   determine that at least two of the plurality of operations can be performed in parallel;
   determine that a first configuration of the plurality of memory components does not allow the at least two operations to be performed in parallel, the first configuration including a first set of power management cohorts; and
   alter an interconnection of the plurality of memory components to change from the first configuration to a second configuration of the plurality of memory components, the second configuration including a second set of power management cohorts that allow the at least two operations to be performed in parallel.

9. The non-transitory computer-readable storage medium of claim 8, wherein altering the interconnection the processing device is further to close a first set of one or more switches to couple a clock signal generated by a first memory component of a first power management cohort to each of the other memory components of the first power management cohort.

10. The non-transitory computer-readable storage medium of claim 9, wherein altering the interconnection the processing device is further to close a second set of one or more switches to couple a data signal amongst a plurality of memory components of the first power management cohort.

11. The non-transitory computer-readable storage medium of claim 8, wherein only a single memory component of a first power management cohort of the second set of power management cohorts has a queued high-power operation.

12. The non-transitory computer-readable storage medium of claim 8, wherein altering the interconnection is conditioned on a flag accessible by a host system.

13. The non-transitory computer-readable storage medium of claim 8, wherein the operation type is one of at least a high-power operation and a low-power operation.

14. The non-transitory computer-readable storage medium of claim 8, wherein:
- the second set of power management cohorts includes a first power management cohort; and
- none of a plurality of memory components of the first power management cohort have a queued high-power operation.

15. A system comprising:
- a plurality of memory components; and
- a processing device, operatively coupled with the plurality of memory components, to:
  - obtain an operation type of each of a plurality of operations queued against one or more of the plurality of memory components; and
  - alter, based on the operation type of each of the plurality of operations, an interconnection of the plurality of memory components to change a grouping of the plurality of memory components from a first set of power management cohorts to a second set of power management cohorts that is different from the first set.

16. The system of claim 15, wherein altering the interconnection the processing device is further to close a first set of one or more switches to couple a clock signal generated by a first memory component of a first power management cohort to each of the other memory components of the first power management cohort.

17. The system of claim 16, wherein altering the interconnection the processing device is further to close a second set of one or more switches to couple a data signal amongst a plurality of memory components of the first power management cohort.

18. The system of claim 15, wherein only a single memory component of a first power management cohort of the second set of power management cohorts has a queued high-power operation.

19. The system of claim 15, wherein altering the interconnection is conditioned on a flag accessible by a host system.

20. The system of claim 15, wherein the operation type is one of at least a high-power operation and a low-power operation.

* * * * *